(12) United States Patent
Hiroyama et al.

(10) Patent No.: US 7,956,366 B2
(45) Date of Patent: Jun. 7, 2011

(54) MONOLITHIC LIGHT EMITTING DEVICE AND DRIVING METHOD THEREFOR

(75) Inventors: Yuichi Hiroyama, Tsukuba (JP); Masahiko Hata, Tsuchiura (JP); Yoshihiko Tsuchida, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 326 days.

(21) Appl. No.: 12/293,196

(22) PCT Filed: Mar. 22, 2007

(86) PCT No.: PCT/JP2007/056746
§ 371 (c)(1),
(2), (4) Date: Oct. 3, 2008

(87) PCT Pub. No.: WO2007/111359
PCT Pub. Date: Oct. 4, 2007

(65) Prior Publication Data
US 2009/0166644 A1  Jul. 2, 2009

(30) Foreign Application Priority Data

Mar. 24, 2006 (JP) ................................ 2006-084209
Jan. 31, 2007 (JP) ................................ 2007-021296

(51) Int. Cl.
*H01L 33/00* (2010.01)
(52) U.S. Cl. ............ 257/88; 257/84; 257/92; 257/98; 257/E33.045; 315/114; 315/216; 315/363
(58) Field of Classification Search .............. 257/84–88, 257/89–99, E27.021; 315/363; 343/82
See application file for complete search history.

(56) References Cited

U.S. PATENT DOCUMENTS 6,864,641 B2  3/2005 Dygert
(Continued)

FOREIGN PATENT DOCUMENTS

JP  H11-331494 A  11/1999
(Continued)

OTHER PUBLICATIONS

Examination Report dated Sep. 22, 2010 for British Application No. GB0818656.1.

*Primary Examiner* — Dung A. Le
(74) *Attorney, Agent, or Firm* — Fitch, Even, Tabin & Flannery

(57) ABSTRACT

A monolithic light-emitting device and driving method therefore includes a plurality of light-emitting diodes, array-arranged monolithically on a single substrate. The light-emitting diodes include a pn junction-containing semiconductor material and a phosphor-containing layer passing light emitted from the semiconductor material, absorbing part, or whole of the light for conversion into light having a different wavelength. The array is constituted of a light-emitting diode group consisting of m (m≧2) pieces of the light-emitting diode, the light emitting diode group being constituted of N types (N≧2, providing N≦m) of light-emitting diodes, each having either one of preset N types of light-emitting spectrum patterns. An average light-emitting spectrum from the whole array can be changed by regulating a power supplied to the light-emitting diodes for each light-emitting diode group sorted according to the type of the light-emitting spectrum pattern.

17 Claims, 21 Drawing Sheets

U.S. PATENT DOCUMENTS

| | | |
|---|---|---|
| 2001/0032985 A1 | 10/2001 | Bhat et al. |
| 2002/0139987 A1 | 10/2002 | Collins, III et al. |
| 2004/0061810 A1 | 4/2004 | Lowery et al. |
| 2004/0206970 A1 | 10/2004 | Martin |
| 2006/0175621 A1 | 8/2006 | Ohtsuka et al. |
| 2006/0284195 A1 | 12/2006 | Nagai |
| 2009/0134420 A1* | 5/2009 | Nagai .............................. 257/98 |

FOREIGN PATENT DOCUMENTS

| | | |
|---|---|---|
| JP | 2002-100480 A | 4/2002 |
| JP | 2003-297127 | 10/2003 |
| JP | 2004-288966 A | 10/2004 |
| JP | 2005-100800 A | 4/2005 |
| JP | 2005-129877 A | 5/2005 |
| JP | 2005-333069 A | 12/2005 |

* cited by examiner

MONOLITHIC LIGHT EMITTING DEVICE AND DRIVING METHOD THEREFOR

CROSS-REFERENCE TO RELATED APPLICATIONS

This is a U.S. National Phase of International Application PCT/JP2007/056746 filed Mar. 22, 2007, and claims the benefit of foreign priority under 35 U.S.C. §119 based on JP 2006-084209, filed Mar. 24, 2006, and JP 2007-021296, filed Jan. 31, 2007, the entire disclosures of all said applications being hereby incorporated herein by reference.

TECHNICAL FIELD

The present invention relates to a monolithic light emitting device, a lighting comprising the same, and a driving method therefor.

BACKGROUND ART

White light emitting diodes including a nitride semiconductor are used widely as a light source for backlight of small liquid crystal display such as cellular phone, and an application as a light source is expected instead of fluorescent lamps from now on. For replacing fluorescent lamps with white light emitting diodes, cost saving is an important problem together with improvement in luminous efficiency. Furthermore, in new technology such as micro machine and capsule type gastric camera, demand for micro lighting is expected to rapidly grow in the future.

White light emitting devices and white light emitting diodes including a nitride semiconductor often used recently are produced, for example, by the following process. First, an epitaxial wafer is subjected to processing such as etching and electrode evaporating coating under suitable conditions, then, one or a plurality of diode chips cut from the wafer by dicing are fixed to a package in the form of cup, and bonding is carried out. Thereafter, a phosphor layer is formed, encapsulated with high transparent resin such as an epoxy resin or silicone resin, and the resin is formed in the form of lens to obtain light emitting diodes. For formation of a phosphor layer, there is generally used a method in which a phosphor is mixed with an epoxy resin or silicone resin, and the mixture is coated quantitatively using a highly accurate, repeatable dispenser. By placing a suitable number of the white light emitting diodes on a substrate for mounting, a white light emitting device having necessary brightness is produced.

White emission lighting including light emitting diodes are classified into two types from the standpoint of structure. In one type, white color is provided by combining a blue light emitting diode with a yellow fluorescent material. In another type, white color is provided by mixing light emissions from three light emitting diodes which emit respectively light three primary colors.

The conventional method of producing white light emitting devices and white light emitting diodes including a nitride semiconductor is as described above, thus, the method is complicated, a special production apparatus is required for maintaining assembly accuracy and quantification precision in the steps of the method, and additionally, checks for every steps are also necessary, leading to a necessity of large equipment investment generating correspondent production cost.

In the case of a white light emitting device used for a light source of backlight or lighting, there are a method in which white color is provided by combination of a blue light emitting diode and a yellow phosphor as described above, and a method in which white color is provided by mixing light emissions from light emitting diodes emitting respectively red (R), green (G) and blue (B), as shown in FIG. 16. The latter is excellent in color rendering as compared with the former, however, if light emission intensity in any one of the three color light emitting diodes changes, color tone, namely its light emitting spectrum pattern tends to vary.

On the other hand, among various lightings marketed widely, a lighting showing various color tones depending on its light emitting device property is provided. there are various color tones such as bulb color, daylight color. These are used property depending on the use object, preference of a user, and the like under various use environments. However, when the use object varies at the same use place or when lighting of different color tone is required by replacement of a user, change of preference of a user itself and the like, it becomes necessary to change the kind of a lighting or to control at most its intensity (brightness), leading to a requirement for a light emitting device capable of controlling color tone more simply and more easily and a lighting including this device.

In the conventional technology, it is necessary to arrange light emitting diode chips by handling them one by one as shown in FIG. 16, in producing a white light emitting device including a light emitting diode. However, since the light emitting diode device has small chip size, handling thereof is difficult. As a result, an expensive high precision handling machines is required, and additionally, it is difficult to scale down the chip size of the light emitting diode device at our disposal, thus, cost saving is difficult.

DISCLOSURE OF THE INVENTION

The present invention has an object of providing a monolithic light emitting device capable of resolving the above-described problems in the conventional technology, a lighting including the same and a driving method therefor.

The present invention has another object of providing a monolithic light emitting device being excellent in color tone stability, capable of controlling color tone, and suitable for miniaturizing, a lighting device including the same and a driving method therefor.

According to the first invention, provided is a monolithic light emitting device for lighting comprising a plurality of light emitting diodes array-arranged monolithically on a single substrate, wherein the light emitting diodes comprise
  a pn junction-containing semiconductor material and
  a phosphor-containing layer passing light emitted from the semiconductor material, or absorbing part or the whole of the light for conversion into light with a different wavelength, and
the array is constituted of a light emitting diode group consisting of m (m≧2) pieces of the light emitting diode, the light emitting diode group is constituted of N types (N≧2, providing N≦m) of light emitting diodes each having either one of preset N types of light emitting spectrum patterns, and an average light emitting spectrum from the whole array can be changed by regulating a power supplied to the light emitting diodes for each light emitting diode group sorted according to the type of the light emitting spectrum pattern.

According to the second invention, provided is a lighting monolithic light emitting device for lighting comprising a plurality of light emitting diodes array-arranged monolithically on a single substrate, wherein the light emitting diodes comprise a pn junction-containing semiconductor material and
a phosphor-containing layer passing light emitted from the semiconductor material, or absorbing part or the whole of the light for conversion into light with a different wavelength, and the array is constituted of a light emitting diode group consisting of m (m≧2) pieces of the light emitting diode, the light emitting diode group is constituted of N types (N≧2, providing N≦m) of light emitting diodes having N types of light emitting spectrum patterns and having at least one kind of white light emitting spectrum pattern, and an average light emitting spectrum from the whole array can be changed by regulating a power supply for each light emitting diode group sorted according to the type of the light emitting spectrum pattern.

According to the third invention, provided is a monolithic light emitting device for lighting comprising a plurality of light emitting diodes array-arranged monolithically on a single substrate, wherein the light emitting diodes comprise
a pn junction-containing semiconductor material and a phosphor-containing layer passing light emitted from the semiconductor material, or absorbing part or the whole of the light for conversion into light with a different wavelength, and the array is constituted of a light emitting diode group consisting of m (m≧2) pieces of the light emitting diode, the light emitting diode group is constituted of N types (N≧2, providing N≦m) of light emitting diodes each having either one of preset N types of white light emitting spectrum patterns, and an average light emitting spectrum from the whole array can be changed by regulating a power supplied to the light emitting diodes for each light emitting diode group sorted according to the type of the white light emitting spectrum pattern.

According to the fourth invention, provided is the device according to the above-described 1, 2 or 3, comprising electrode parts on each one side of the light emitting diodes constituting the light emitting diode group are connected to a group-common electrode, electrode parts on each another side of the light emitting diodes constituting the light emitting diode group are connected, for each light emitting diode group, to N pieces of electrode common to the group provided corresponding to the light emitting diode group, wherein intensities or light emitting spectrum patterns for N types of emitting spectra can be changed and an average light emitting spectrum from the whole array can be changed by regulating a power supplied through the group-common electrode and N pieces of electrode common to the group.

According to the fifth invention, provided is the device according to the above-described 1, 2 or 3, comprising at least one electric conductive semiconductor layer mutually common to a plurality of pn junction-containing light emitting diodes constituting the light emitting diode group, wherein the electric conductive semiconductor layer has in common an electric conductive layer situated at a nearer position to the substrate, and wiring for connecting the electrode parts of the light emitting diodes constituting the light emitting diode group to an electrode part for external connection is monolithically formed on the substrate.

According to the sixth invention, provided is the device according to the above-described 1, 2 or 3, wherein the phosphor-containing layer is in close to, or is connected directly to the light emitting diode including the pn junction semiconductor.

According to the seventh invention, provided is the device according to the above-described 1, 2 or 3, wherein the m pieces of light emitting diode of the array are formed so close to mutually that emitting spectra from a light emitting diode cannot be distinguished from emitting spectra of the other light emitting diode under environment where a lighting is used.

According to the eighth invention, provided is the device according to the above-described 1, 2 or 3, comprising light mixing parts containing a light scattering member in the light emitting directions from the m pieces of light emitting diode of the array, wherein the m pieces of light emitting diode of the array are formed so close to mutually that emitting spectra from a light emitting diode cannot be distinguished from emitting spectra of the other light emitting diode under environment where a lighting is used.

According to the ninth invention, provided is the device according to the above-described 1, 2 or 3, comprising a light receiving device formed monolithically on the substrate close to the light emitting diodes, an electrode necessary for electrically connecting the light receiving device to the outside, and a connection wiring thereof, to absorb part of light from the light emitting diode, leading to generate electromotive force to supply electricity for outside.

According to the tenth invention, provided is the device according to the above-described 1, 2 or 3, wherein a capacitor which is made of dielectric material or diode which has opposite polarity to the light emitting diode is formed on the substrate closed to the light emitting diode, said capacitor or diode is connected in parallel with the light emitting diode.

According to the eleventh invention, provided is the device according to the above-described 1, 2 or 3, wherein the wavelength of light emitted from the semiconductor of the light emitting diode is 470 nm or less.

According to the twelfth invention, provided is the device according to the above-described 1, 2 or 3, wherein the semiconductor of the light emitting diode is a nitride semiconductor having a wurtzite crystal structure.

According to the thirteenth invention, provided is the device according to the above-described 1, 2 or 3, wherein the phosphor of the light emitting diode is made of organic material.

According to the fourteenth invention, provided is the device according to the above-described 1, 2 or 3, wherein the phosphor of the light emitting diode is made of polymer material.

According to the fifteenth invention, provided is a lighting comprising the device as described in the above-described 1, 2 or 3.

According to the sixteenth invention, provided is a method of driving the monolithic light emitting device as described in the above-described 1, 2 or 3, wherein the light emitting diode is controlled by the driving current or driving time for each of the light emitting diode group, to control the whole average light emitting spectrum pattern.

According to the seventeenth invention, provided is a method of driving the monolithic light emitting device as described in the above-described 9, wherein the whole average light emitting spectrum pattern is feedback-controlled in accordance with output of the light receiving device.

Figure 1:
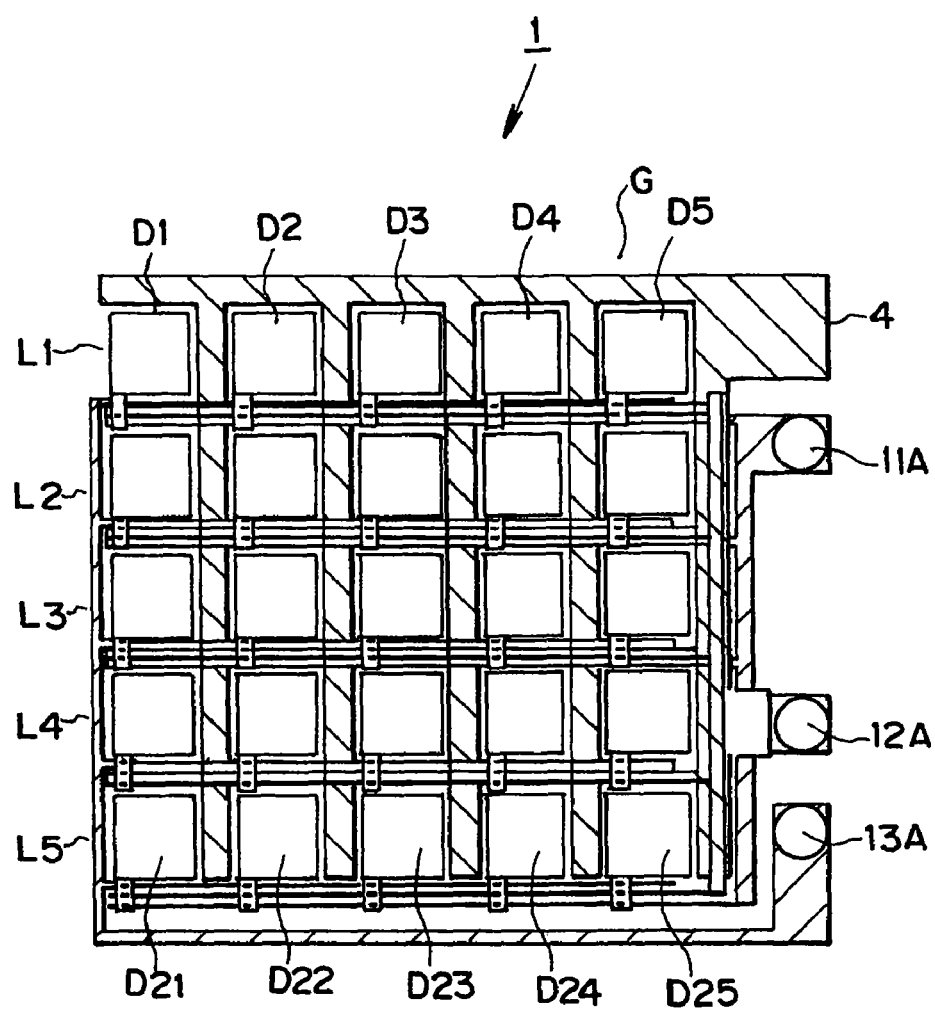
FIG. 1 shows a planar view of an embodiment (monolithic light emitting device) of the present invention.

EXPLANATION OF MARKS 1, 101, 302: light emitting device
2: sapphire substrate
3: semiconductor substrate
4: common electrode
5, 6: active layer
7: P semi-transparent electrode
81, 82, 83: phosphor layer
9: insulating layer
11, 12, 13: electrode
111, 112, W1, W2, W3: wiring
121, 122, 123, 124: light emitting diode
201: light emitting diode cell
202: common
203: p wiring
301A: light incident face
301: light guide plate
303, 304: diffusion plate
305: light source
401: substrate
402: light emitting diode part
403: sensor part
404: control unit
405, 406: diode
407: capacitor
408: light emitting diode circuit
501: light emitting diode functional layer
502: transistor functional layer
601: light emitting diode
602: printed circuit board
D1 to D25: light emitting diode
G: light emitting diode group
L: group III nitride epitaxial layer

MODE OF CARRYING OUT THE INVENTION

An embodiment of the present invention is described in detail below referring to drawings.

FIG. 1 is a planar view showing an embodiment of a light emitting device for lighting according to the present invention. The light emitting device for lighting 1 is constituted of a plurality of semiconductor light emitting diodes, and the light emitting device 1 includes a light emitting diode array constituted of m pieces (m≧2) of light emitting diodes. These m pieces of light emitting diodes constitute as a whole one light emitting diode group. The light emitting diode group is constituted of N types of light emitting diodes each having either one of preset N types of light emitting spectrum patterns.

Since the light emitting device 1 is constituted as described above, output light is emitted from individual light emitting diode of the light emitting device 1, and the output light include N types of lights having mutually different color tones, and the output light is emitted as mixed light from the light emitting device 1.

In the embodiment shown in FIG. 1, 25 pieces (m=25) of light emitting diodes D1 to D25 are arranged as an array of 5×5, constituting a light emitting diode group G. In the embodiment, N=3 and the array includes 3 types of white light emitting diodes of different color tones. The first color tone (group 1) shows slightly bluish white, the second color tone (group 2) shows slightly greenish white, and the third color tone (group 3) shows slightly reddish white.

In the embodiment of FIG. 1, light emitting diodes D1, D4, D7, D10, D13, D16, D19, D22 and D25, among 25 pieces of light emitting diodes D1 to D25, belong to the group 1, light emitting diodes D2, D5, D8, D11, D14, D17, D20 and D23 belong to the group 2, and light emitting diodes D3, D6, D9, D12, D15, D18, D21 and D24 belong to the group 3, and the light emitting diodes D1 to D25 are grouped into three light emitting diode groups according to the above-described 3 types of color tones. That is, there are a first light emitting diode group including light emitting diodes of the first color tone, a second light emitting diode group including light emitting diodes of the second color tone, and a third light emitting diode group including light emitting diodes of the third color tone.

Of these light emitting diodes D1 to D25, D1 to D5 are arranged in the first row L1, D6 to D10 are arranged in the second row L2, D11 to D15 are arranged in the third row L3, D16 to D20 are arranged in the fourth row L4 and D21 to D25 are arranged in the fifth row L5, in this order, as shown in FIG. 1, therefore, lights emitted from the light emitting diodes are uniformly mixed.

Figure 2:
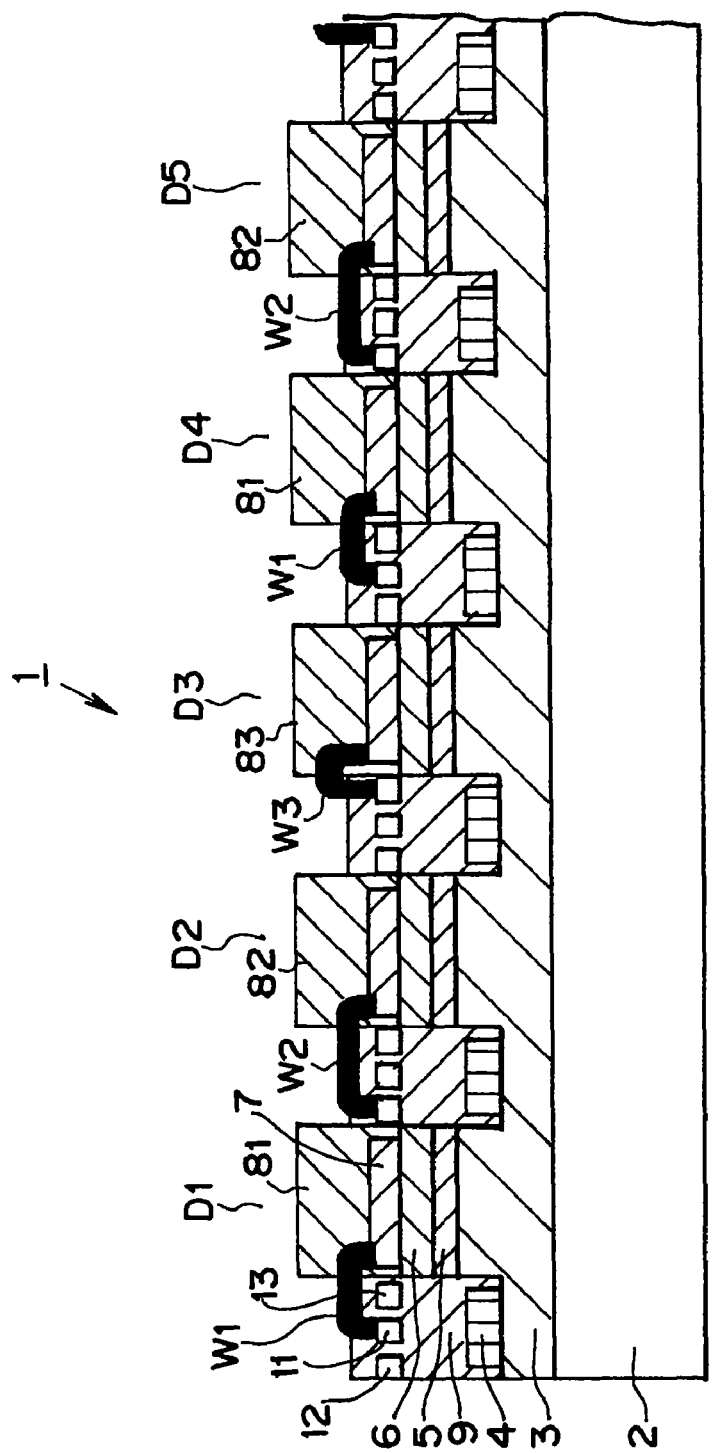
FIG. 2 shows a cross-sectional view of the first row of an array of a monolithic light emitting device.

FIG. 2 is a partial cross-sectional view of the first row L1 of FIG. 1. In FIG. 2, 2 represents a sapphire substrate, 3 represents a semiconductor substrate, and 4 represents an n type electrode. In the light emitting diode D1, a P semi-transparent electrode 7 is formed on active layers 5 and 6 formed on the semiconductor substrate 3, and between the active layers 5 and 6, pn junction is formed. In thus constituted light emitting diode D1, a phosphor layer 81 is formed. The phosphor layer 81 is formed directly on the P semi-transparent electrode 7, however, the formation of the phosphor layer 81 on the light emitting diode D1 is not limited to this, and an appropriate constitution can be adopted such that the phosphor layer 81 is formed close to the light emitting diode D1.

Mark 9 represents an insulating layer, and in the insulating layer 9, a first electrode 11, second electrode 12 and third electrode 13 are formed, in addition to a common electrode 4. The P semi-transparent electrode 7 of the light emitting diode D1 is connected to the first electrode 11 via wiring W1. The first electrode 11 is an electrode for supplying power in common to light emitting diodes belonging to the first light emitting diode group, and in addition to the light emitting diode D1, a P semi-transparent electrode 7 of another light emitting diode belonging to the first light emitting diode group is connected to the first electrode 11.

Though the light emitting diode D1 is explained in detail above, other light emitting diodes belonging to the group 1 also have the same constitution. Also light emitting diodes belonging to the groups 2 and 3 have the same basic constitution as those of the light emitting diode D1. However, the light emitting diode belonging to the group 2 is different in that a phosphor layer 82 having a fluorescent property different from that of the phosphor layer 81 is formed, and the P semi-transparent electrode 7 is connected via wiring W2 to a second electrode 12 as an electrode for supplying power in common to light emitting diodes belonging to the second light emitting diode group. Further, the light emitting diode belonging to the group 3 is different in that a phosphor layer 83 having a fluorescent property different from that of the phosphor layer 81 is formed, and the P semi-transparent electrode 7 is connected via wiring W3 to a third electrode 13 as an electrode for supplying power in common to light emitting diodes belonging to the third light emitting diode group.

In any event, all the light emitting diodes D1 to D25 are formed monolithically on one semiconductor substrate 3, and when voltage is applied between active layers 5 and 6 of these light emitting diodes via electrodes, light is emitted from a semiconductor material having pn junction and from the semiconductor. Part or the whole of the emitted light is absorbed by any of the phosphor layers 81, 82 and 83, and by this, the emitted light is converted into light of different wavelength and released into outside.

Since the light emitting device 1 is constituted as described above, to ends 11A, 12A and 13A for connecting to outside formed respectively on the first electrode 11, second electrode 12 and third electrode 13, corresponding driving circuits are connected, and light emission intensities for the groups 1, 2, and 3, that is, light emission intensities for three color tones can be changed independently. In this driving method, the whole average light emitting spectrum pattern can be controlled by changing the driving current or driving time for each of the light emitting diode groups.

Figure 3:
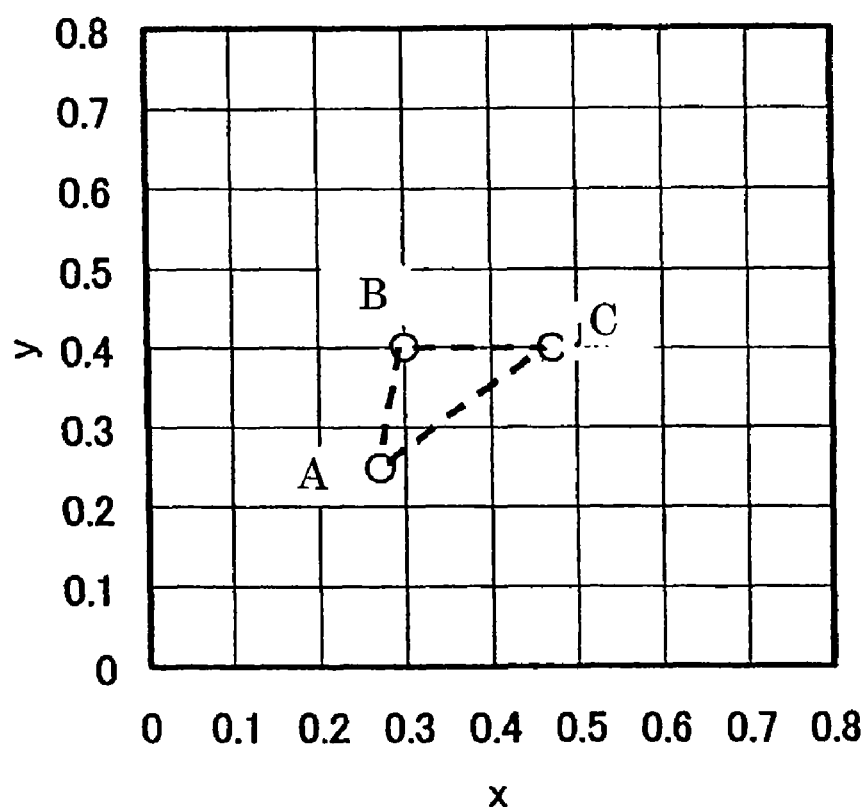
FIG. 3 shows chromatic coordinate in a chromaticity diagram of three color tone groups of the light emitting device shown in FIG. 1.

In the embodiment shown in FIG. 1, when the first to third light emitting diode groups are allowed to emit light independently, emission colors of the light emitting diode groups appear at three points of coordinate A, coordinate B and coordinate C deviated to blue, green and red from X=0.30 and Y=0.30 in the CIE chromatic coordinate, as shown in FIG. 3. When all the light emitting diodes D1 to D25 are allowed to emit light simultaneously and the current quantity is controlled for each of the light emitting diode groups, color tone of any coordinate can be obtained in a region surrounded by three points of coordinate A, coordinate B and coordinate C. Therefore, according to the light emitting device 1, white lighting capable of controlling color tone depending on the preference of a user is provided.

Since the color tone of each light emitting diode group is thus set at a point slightly deviated from X=0.30 and Y=0.30 in the CIE chromatic coordinate, color tone control of white emission color can be carried out easily by controlling the light emission intensity of each of the light emitting diode groups, and the controlled color tone stability can be enhanced.

From the viewpoint of enhancing the whole color tone stability, it is ideal that the coordinate A, coordinate B and coordinate C are situated as close as possible to X=0.30 and Y=0.30, however, for the viewpoint of controlling color tone so that persons can recognize as described above, it is necessary that each of them has deviation. From the viewpoint of functioning as approximate practical lighting, it may be permissible that the color temperature can be controlled in a range of from 3000 K to 15000 K.

Figure 4:
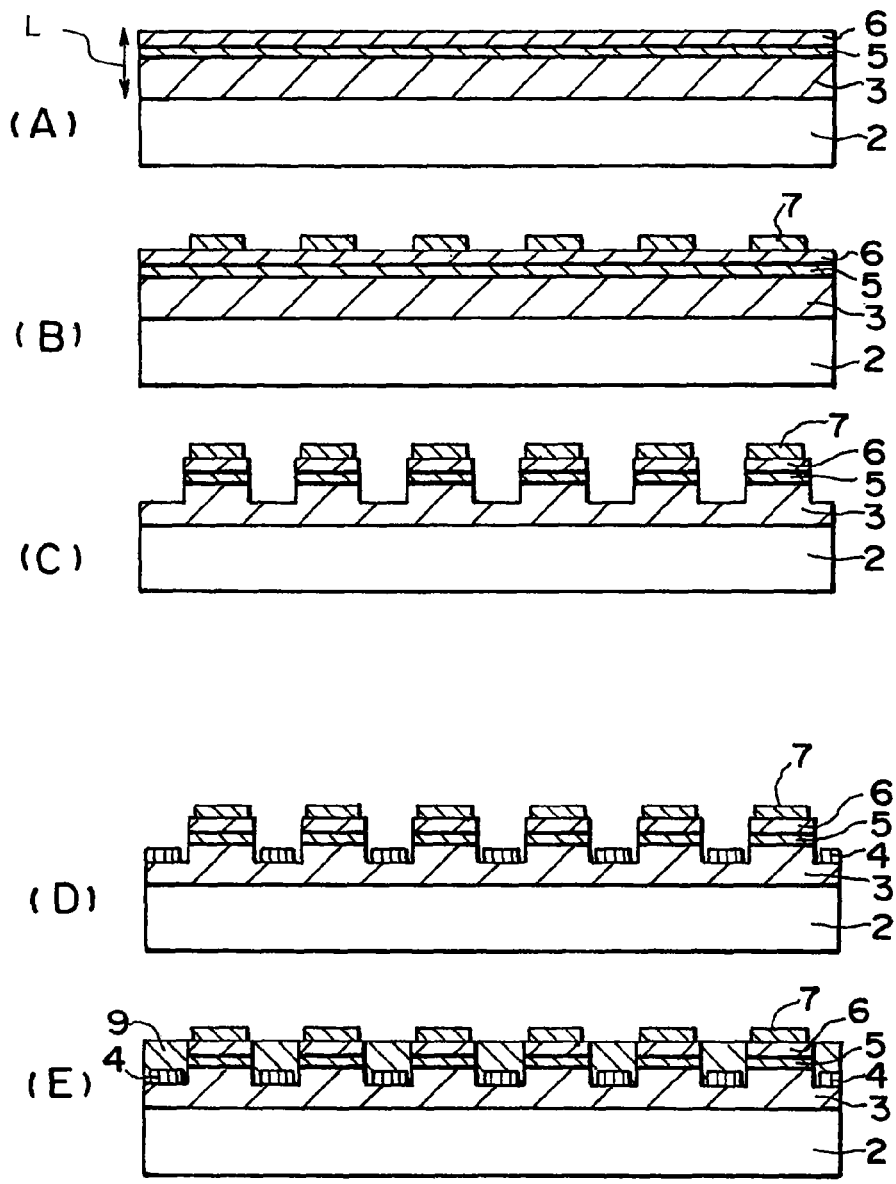
FIG. 4 shows steps in the method for producing the light emitting device shown in FIGS. 1 and 2.
Figure 5:
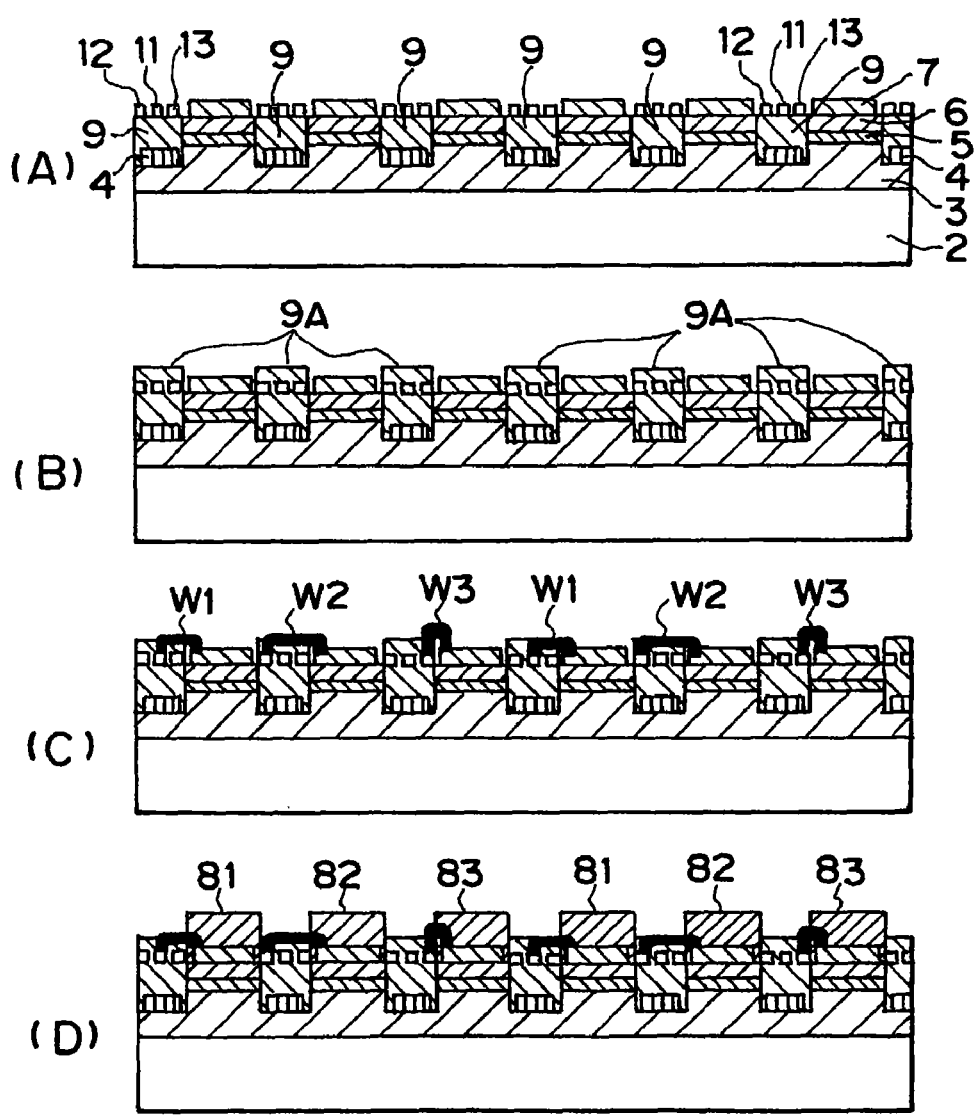
FIG. 5 shows steps in the method for producing the light emitting device shown in FIGS. 1 and 2.

FIGS. 4 and 5 illustrate the method for producing the light emitting device 1 shown in FIGS. 1 and 2. FIG. 4 (A) to (E) show the first to fifth steps thereof, and FIG. 5 (A) to (D) show the subsequent to sixth to ninth steps.

An embodiment of the method for producing the light emitting device 1 is illustrated referring to FIGS. 4 and 5. First, a sapphire substrate 2 is prepared, and a semiconductor substrate 3 and active layers 5 and 6 are formed thereon (FIG. 4 (A)). Then, on the active layer 5, a P semi-transparent electrode 7 is formed (FIG. 4 (B)), and etching is carried out to expose the semiconductor substrate 3 and a plurality of light emitting diodes are formed (FIG. 4 (C)).

In the next step, on the exposed semiconductor substrate 3, a common electrode 4 is formed (FIG. 4 (D)), thereafter, an insulating layer 9 made of SiO and the like is formed, and the common electrode 4 is buried in the insulating layer 9 (FIG. 4 (E)).

On thus formed insulating layer 9, a first electrode 11, second electrode 12 and third electrode 13 which are three independent electrodes are formed in a given pattern (FIG. 5 (A)). An insulating layer for bridge 9A is formed, and the first electrode 11, second electrode 12 and third electrode 13 are buried (FIG. 5 (B)), and wirings W1, W2 and W3 are formed for connecting the P semi-transparent electrode 7 to a required electrode among the first electrode 11, second electrode 12 and third electrode 13 (FIG. 5 (C)). Finally, a resin layer containing a phosphor is coated up to necessary thickness on the P semi-transparent electrode 7 by using a screen printing and the like, to form phosphor layers 81, 82 and 83 (FIG. 5 (D)). In the steps up to this stage a monolithic treatment is carried out while keeping the wafer shape. Then, a wafer is separated for each device, obtaining the light emitting device shown in FIGS. 1 and 2.

The white light emitting device according to the present invention can be produced by repeating a processing mainly including photolithography of wafer unit. Therefore, a white light emitting device formed in a simpler manner with better positional precision as compared with a conventional white light emitting device is obtained. Since, simultaneously, yield is excellent and an apparatus with high precision becomes unnecessary, a white light emitting device can be produced with low cost. Further, according to the present invention, difficulty for miniaturizing lowers in comparison with conventional methods for fabricating an individual elemental device.

Further, a lighting can be provided which is sensitive particularly in the visual sensitivity range, excellent in white color tone controlling function and having stability, and which can be used in wider applications by changing color tone as white (namely, average light emitting spectrum pattern) depending on its application and use condition.

Though the present invention is effective particularly in the white lighting region, it is not limited to white from the standpoint of its theory, and by adding a light emitting diode having a specific wavelength region showing white as basic tone into an array, color tone deviated from white and showing the above-described specific wavelength emphasized according to the use object can also be provided.

For example, color tone close to sunshine condition under tree shade can be provided by adding a green component, color tone close to dusk shadow can be provided by adding a red/orange component, and color tone close to sea bottom atmosphere can be provided by adding a blue component, respectively, and a lighting apparatus showing a wider color tone region over the conventional lighting frame can be provided in the form of low cost semiconductor chip.

As the phosphor, organic low molecular weight phosphors and high molecular weight phosphors can be used, in addition to inorganic phosphors generally used now. Inorganic phosphors are already used widely, and can be applied to the present invention as a material having high reliability. Organic phosphors are formed easily and can be used suitably by using a printing technology and the like in addition to usual lithography in producing a light emitting diode array having particularly small cell size since the organic phosphors are not in the form of particle like inorganic phosphors.

The organic material which can be used as the phosphor of the present invention is a compound showing fluorescence and/or phosphorescence at room temperature, and may have low molecular weight or high molecular weight.

When a polymer compound is used as the phosphor, it is generally a compound having an average molecular weight of 1000 or more. Those containing a repeating unit of the following formula (1) are exemplified.

$$-Ar_1- \quad\quad\quad \text{formula (1)}$$

$Ar_1$ represents a group selected from the group consisting of arylene groups, divalent heterocyclic compounds and divalent aromatic amine groups.

$Ar_1$ is a group selected from the group consisting of arylene groups, divalent heterocyclic compounds and divalent aromatic amine groups.

The divalent heterocyclic compound group means an atom group remaining after removing two hydrogen atoms from a heterocyclic compound, and includes also those having a condensed ring, and those in which independent two or more monocyclic heterocyclic compounds or condensed rings are connected directly or via a group such as vinylene and the like. Also those in which a heterocyclic compound and an aromatic hydrocarbon are connected are included. The divalent heterocyclic compound group optionally has a substituent. The carbon number of the divalent heterocyclic compound group excepting the substituent is usually about 4 to 60, preferably 2 to 20. The total carbon number of the divalent heterocyclic compound group including the substituent is usually about 2 to 10. The heterocyclic compound refers to organic compounds having a cyclic structure in which elements constituting the ring include not only a carbon atom, but also a hetero atom such as oxygen, sulfur, nitrogen, phosphorus, boron and the like contained in the ring.

The divalent aromatic amine group means an atom group remaining after removing two hydrogen atoms from an aromatic amine. The divalent aromatic amine group optionally has a substituent. The carbon number of the divalent aromatic amine group excepting the substituent is usually about 4 to 60.

The polymer fluorescent material to be used as the phosphor in the present invention may be a homopolymers containing a single repeating unit, or a copolymer containing several kinds of repeating units. For realizing a structure having appropriately both functions of light emission and charge transportation, it is preferable to use a copolymer. In this case, the structure of the polymer compound may be any of random, block, graft and the like, or a combination thereof. In the case of branched type, hyper branch which is not simple branch may also be permissible.

As the light emitting material which can be used as the phosphor of the present invention, conventional low molecular weight compounds and triplet light emitting complexes are also mentioned. The examples of the low molecular weight compound, include naphthalene derivatives; anthracene and its derivatives; perylene and its derivatives; polymethine-, xanthene-, coumarin- and cyanine-coloring matters; metal complexes of 8-hydroxyquinoline and its derivatives; aromatic amines; tetraphenylcyclopentadiene and its derivatives; tetraphenylbutadiene and its derivatives. Specifically, compounds such as those described in, for example, JP-A Nos. 57-51781, 59-194393 can be used.

When these polymer phosphors soluble in organic solvents are used in producing a device, it may be advantageous to simply remove a solvent by drying after coating of a solution in the case of film formation from the solution.

As the film formation method from a solution, coating methods such as a spin coating, casting, micro gravure coating, gravure coating, bar coating, roll coating, wire bar coating, dip coating, spray coating, screen printing, flexo printing, offset printing, inkjet printing and the like can be used. Printing method such as a screen printing, flexo printing, offset printing, inkjet printing and the like are preferable since pattern formation and multicolor separate painting are easy.

In the case of lamination of a thin film using a solution, it is necessary that a layer in contact with a solution is not dissolved by the solution used. Therefore, in the case of lamination from a solution by the above-described method, it is necessary to adopt a method of selecting the type of a solvent so that a solution to be used in thin film formation does not dissolve a layer coming into contact with the solution, or a method in which a layer in contact with a solution is insolubilized by photocrosslinking or thermal crosslinking, then, lamination from the solution is carried out. According to the constitution of laminating a thin film, it is possible to change appropriately chromaticity by combining with a light emitting device.

As the solution (ink composition) to be used in the printing method and the like, at least one of polymer phosphors may be advantageously contained, and in addition to the polymer phosphor, additives such as a light emitting material, solvent, stabilizer, ultraviolet hardening agent, thermal hardening agent and the like may be contained.

The suitable value of the viscosity of an ink composition varies depending on the printing method. When an ink composition passes through a discharge apparatus such as in an inkjet print method and the like, the viscosity at 25° C. is preferably from 1 to 20 mPa·s, more preferably from 5 to 20 mPa·s, further preferably from 7 to 20 mPa·s, for preventing clogging and curving in flying in discharging.

The solution (ink composition) to be used in the printing method and the like may contain additives for regulating viscosity and/or surface tension in addition to the polymer compound. As the additive, a polymer compound (thickening agent) having high molecular weight for enhancing viscosity and a poor solvent, a compound of low molecular weight for lowering viscosity, a surfactant for decreasing surface tension, and the like may be appropriately combined and used.

As the above-described polymer compound having high molecular weight, a compound which is soluble in the same solvent as for the polymer compound of the present invention and which does not disturb light emission and charge transportation may be used. For example, polystyrene of high molecular weight, polymethyl methacrylate, polymer compounds of the present invention having larger molecular weights, and the like can be used. The polystyrene-reduced weight-average molecular weight is preferably 500000 or more, more preferably 1000000 or more.

It is also possible to use a poor solvent as a thickening agent. Namely, by adding a small amount of poor solvent for the solid content in a solution, viscosity can be enhanced. When a poor solvent is added for this purpose, the kind and addition amount of the solvent may be advantageously selected within a range not causing deposition of solid components in a solution. When stability in preservation is taken into consideration, the amount of a poor solvent is preferably 50 wt % or less, further preferably 30 wt % or less based on the whole solution.

The solution of the present invention may contain an antioxidant for improving preservation stability. As the antioxidant, a compound which is soluble in the same solvent as for the polymer phosphor and which does not disturb light emission and electric charge transportation is permissible, and exemplified are phenol-type antioxidants, phosphorus-based antioxidants and the like.

Though the solvent to be used is not particularly restricted, those capable of dissolving or uniformly dispersing materials other than the solvent constituting the ink composition are preferable.

Exemplified as the solvent are chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane, anisole and the like, aromatic hydrocarbon solvents such as toluene, xylene, ethylbenzene, diethylbenzene, trimethylbenzene, n-propylbenzene, isopropylbenzene, n-butylbenzene, isobutylbenzene, s-butylbenzene, ethoxybenzene, cyclohexylbenzene, 1-methylnaphthalene and the like, aliphatic hydrocarbon solvents such as cyclohexane, methylcyclohexane, n-pentane, n-hexane, n-heptane, n-octan, n-nonane, n-decane, bicyclohexyl, n-heptylcyclohexane, n-hexylcyclohexane, bicyclohexyl and the like, ketone solvents such as acetone, methyl ethyl ketone, cyclohexanone, benzophenone, acetophenone, cyclohexenylcyclohexanone, 2-propylcylohexanone, 2-heptanone, 3-heptanone, 4-heptanone, 2-octanone, 2-nonanone, 2-decanone, dicyclohexyl ketone, bicyclohexyl and the like, ester solvents such as ethyl acetate, butyl acetate, ethylcellosolve acetate, methyl benzoate, phenyl acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like.

These organic solvents can be used singly or in combination of two or more. Of them, preferable from the standpoint of solubility of a polymer compound and the like, uniformity in film formation, viscosity property and the like are aromatic hydrocarbon solvents, aliphatic hydrocarbon solvents, ester solvents and ketone solvents, and toluene, xylene, ethylbenzene, diethylbenzene, trimethylbenzene, n-propylbenzene, i-propylbenzene, n-butylbenzene, isobutylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexanone, 2-propylcyclohexanone, 2-heptanone, 3-heptanone, 4-heptanone, 2-octanone, 2-nonanone, 2-decanone, dicyclohexyl ketone, acetophenone and benzophenone are more preferable.

The number of solvents in a solution is preferably 2 or more, more preferably 2 to 3, further preferably 2, from the standpoint of a film forming property and from the standpoint of device properties and the like. When two solvents are contained in a solution, one of them may be solid at 25° C. From the standpoint of a film forming property, it is preferable that one solvent has a boiling point of 180° C. or higher, and a solvent having a boiling point of 200° C. or higher is more preferable. From the standpoint of viscosity, it is preferable that an aromatic polymer is dissolved in an amount of 1 wt % or more at 60° C. in both solvents, and it is preferable that one of two solvents dissolves an aromatic polymer in an amount of 1 wt % or more at 25° C.

When two or more solvents are contained in a solution, the content of a solvent having highest boiling point is preferably 40 to 90 wt %, more preferably 50 to 90 wt %, further preferably 65 to 85 wt % based on the weight of all solvents in the solution from the standpoint of viscosity and film forming property.

In the above-described embodiment, a formation of a plurality of white light emitting diodes D1 to D25 on a single epitaxial substrate is explained. However, each light emitting diode may include two or more white light emitting diodes of different color tones in a certain region of a chromaticity diagram, alternatively, also wiring, protective circuit, light receiving device and feedback control and driving circuit using light receiving device can be produced, in addition to the light emitting diode, monolithically on an epitaxial substrate mainly by a photolithography process. Further, as described above, wider range of color tone can also be obtained by adding a light emitting diode group of other color tone than white showing white as basic tone.

Figure 6:
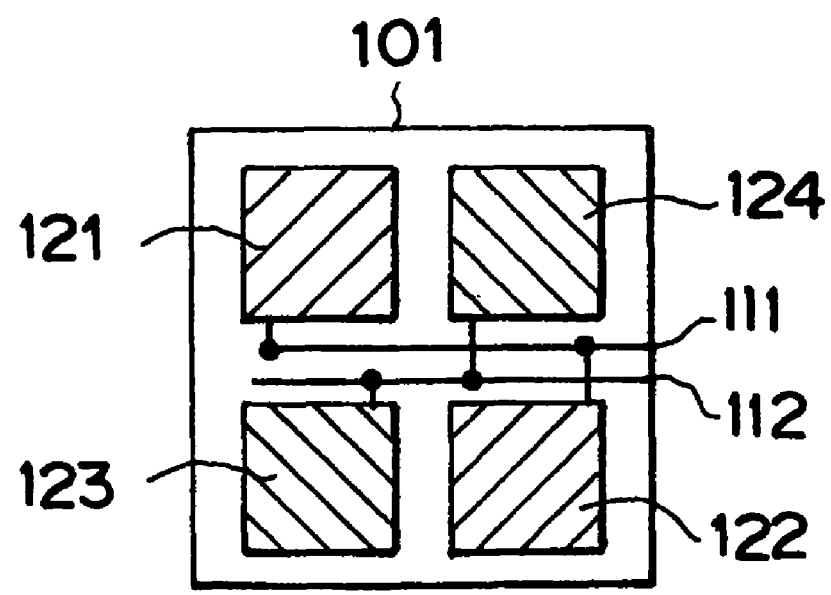
FIG. 6 shows a second embodiment (monolithic light emitting device) of the present invention.
Figure 7:
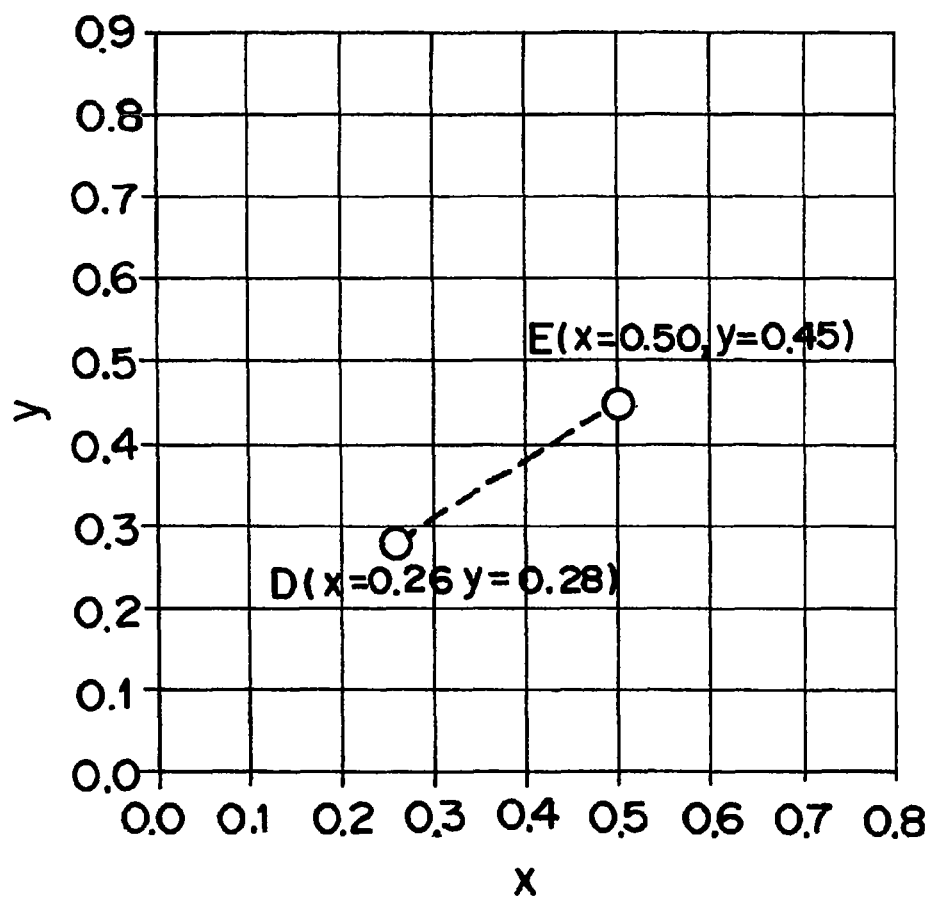
FIG. 7 shows a feasible range of color tone in chromatic coordinate of the second monolithic light emitting device.

FIG. 6 shows another embodiment of the present invention. In the example of FIG. 6, a light emitting diode 101 containing 2×2 arranged light emitting diodes is shown. On light emitting diodes 121 and 122 situated at opposing corner positions and connected in parallel with wiring 111, phosphor layers are formed so as to obtain slightly bluish white light emission of chromaticity coordinates x=0.26 and y=0.28 (chromaticity coordinate point A) according to Commission internationale de l'éclairage (CIE). On light emitting diodes 123 and 124 connected in parallel with another wiring 112, phosphor layers are formed so as to obtain slightly reddish white light emission of CIE chromaticity coordinates x=0.50 and y=0.45 (chromaticity coordinate point B). By regulating electric current for each color tone group for these two types of white light emitting diodes of different color tones, in the same manner as in the case of the above-described embodiment, the light emitting device 101 can show white light at any coordinate on a line connecting from the chromaticity coordinate point D to the chromaticity coordinate point E in FIG. 7.

Further, the placement (arrangement) of a light emitting diode cell in a module is not limited to the placement in the form of square matrix described above, and various constitutions can be adopted according to the supplication thereof. For example, a constitution can also be adopted as shown in FIG. 8 in which a plurality of light emitting diodes 201 are placed in the form of line, and line-placed these light emitting diodes 201 are divided into a plurality of groups of different color tones and connected in parallel for each of the color tone groups.

Figure 8:
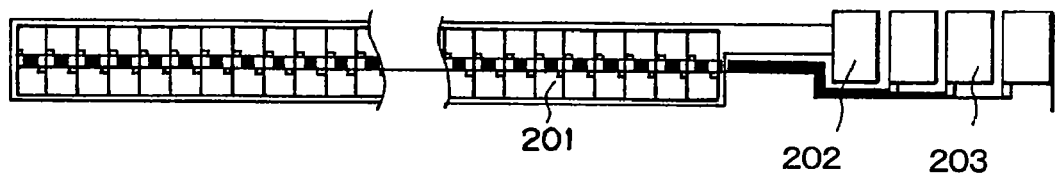
FIG. 8 shows a planar view of the second monolithic light emitting device.

The light emitting device of the constitution shown in FIG. 8 can be used as a light source for a backlight of various flat panel displays. In a backlight of a flat panel display, it is important that uniformity in brightness on the display surface is improved. A backlight of a flat panel display is usually composed of a light source, light mixing part, light guide part and polarization part.

Figure 9:
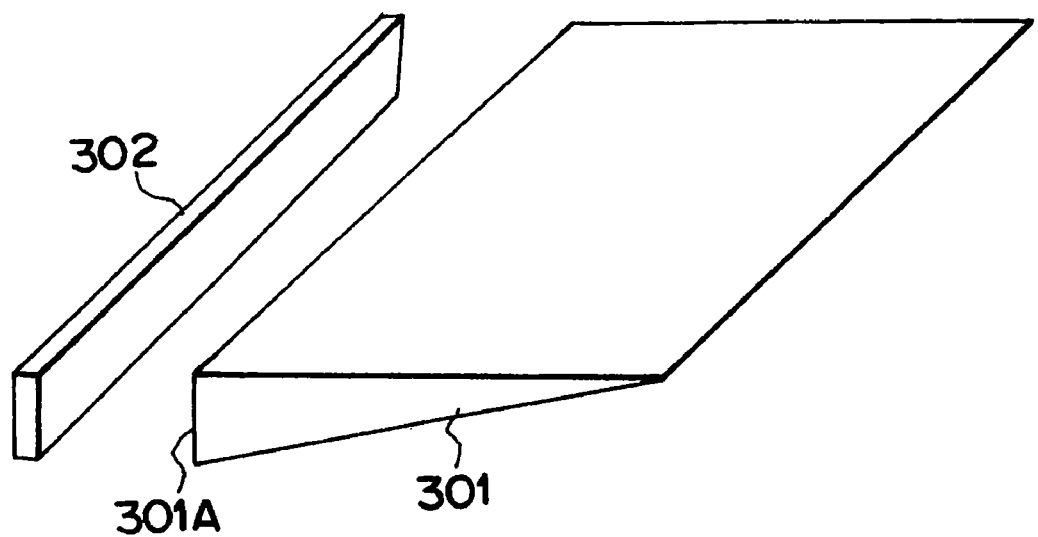
FIG. 9 shows a structure of backlight as an applied example of the second monolithic light emitting device.

FIG. 9 shows an application thereof, and a pseudo surface emitting light source can be obtained by using a light emitting device 302 in the form of line having a size corresponding to the widths and heights of a light incident face 301A and a light guide plate 301 and having a constitution as shown in FIG. 8.

Figure 10:
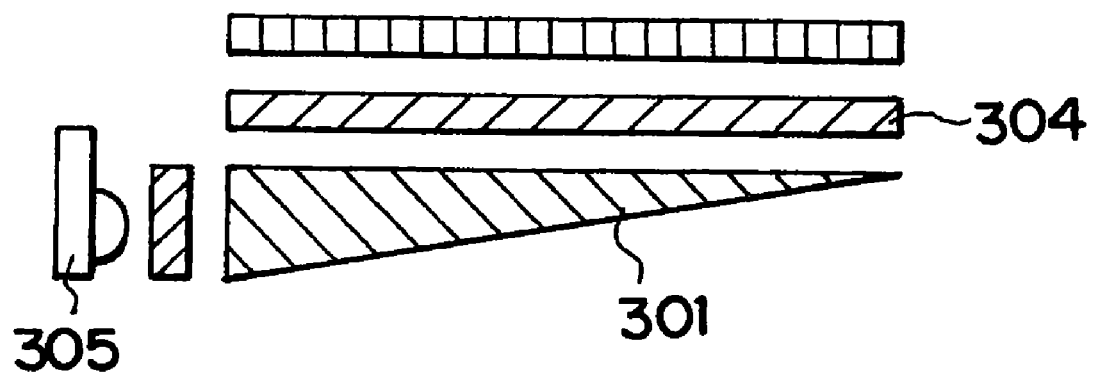
FIG. 10 shows a structure of conventional backlight using a point light source.
Figure 11:
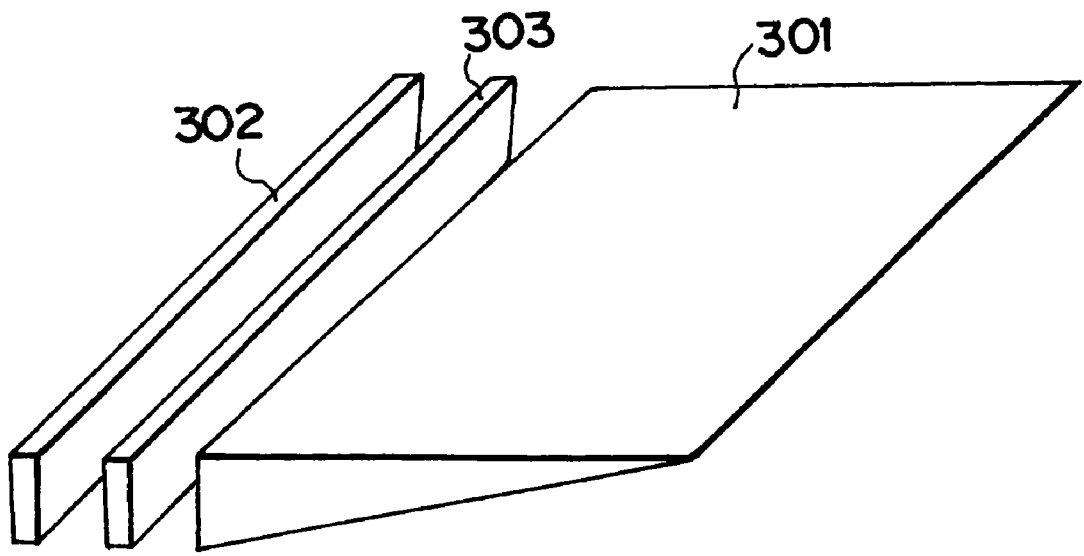
FIG. 11 shows a modified example of conventional backlight.

As compared with a point light source type using one white diode widely used currently as shown in FIG. 10, light emitted from the white light emitting device can be introduced efficiently to the light guide plate and uniformity in brightness can be improved. In the conventional constitution including the light source 305 of point light source type shown in FIG. 10, a diffusion plate 304 is generally placed between the light guide plate 301 and a liquid crystal panel (not shown), the plate 304 having approximately the same area as that of the liquid crystal panel, while according to the light emitting device 302 of the present invention, brightness uniformity can be improved remarkably as compared with the conventional device. Namely, it is advantageous to only place, as a light mixing part, a diffusion plate 303 which is so small as a light emitting module, between the light emitting device 302 and the light guide plate 301 as shown in FIG. 11, thus, a backlight module can be produced at low cost.

The light emitting device of the present invention can provide a lighting of white color tone variable mode using a micro semiconductor light emitting device, and can be used as a lighting which is inserted into a slim tube or narrow gap and illuminates the inside for inspection. In micro lighting which can be provided by the present invention, it is necessary to improve uniformity in brightness in a light emitting face of a white light emitting device smaller as much as possible. It has been found by various experiments that, for improving the uniformity, sizes of cells at a light emitting part and placement interval thereof are important factors.

The mutual interval of individual light emitting diodes constituting an array is preferably 0.015° (54 seconds) or less, more preferably 0.0075° (27 seconds) or less in terms of view angle, for example, in the case of direct looking of lighting from a given distance, and these correspond to 80 μm or less and 40 μm or less, respectively, in terms of distance between light emitting diodes when a distance of 30 cm is hypothesized. Usually, below such a view angle, visual resolution of naked eyes is deficient, and lights emitted from light emitting diodes, which are mutually mixed, are observed by the naked eyes.

Two types of modules are produced which have a light emission cell size of 300 μm square, and cell distance of 100 μm (type A) and 20 μm (type B). When observed from a distance of 10 cm from the light emitting module, lights emitted form individual cells are distinguished from the other in the type A, while in the type B, lights of separate color tones are seen in admixture. When the distance from the light emitting module is over 100 cm, the whole module is seen as one point light source even in the type A. This experiment shows that it is important to form light emitting diodes closely according to the use environment thereof. An effect of the distance between light emitting cells is examined, however, the size of a light emitting cell is also expected to influence a color mixing property. That is, a color mixing property is improved also by reducing the size of a light emitting cell. Therefore, the present invention capable of producing closely micro light emitting cells with good controllability is extremely important for providing a micro light source with which a distance from the light source to an object to be illuminated is hypothesized to small.

Figure 12:
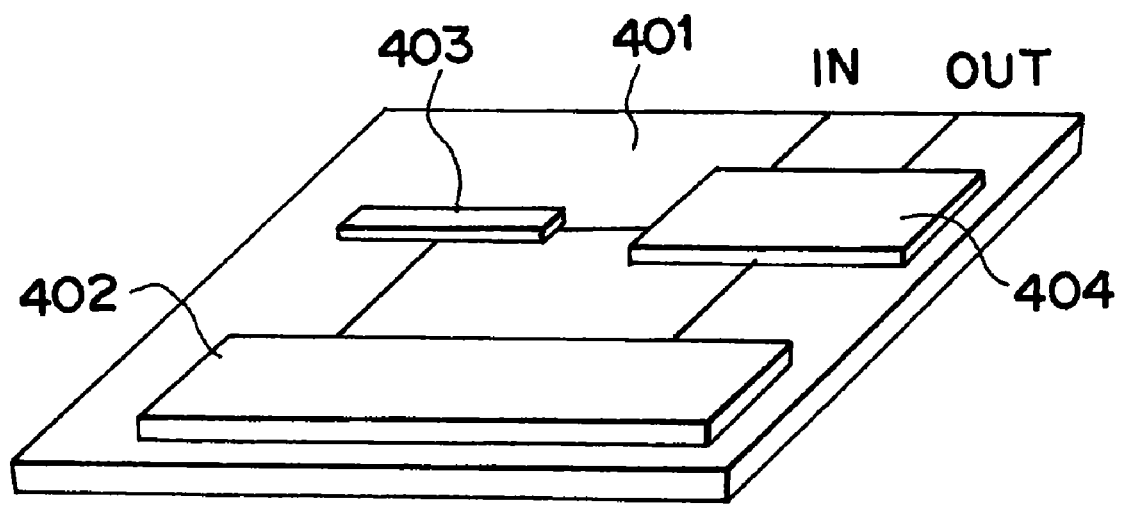
FIG. 12 shows a third embodiment (monolithic light emitting device) of the present invention.

A further developed embodiment of the present invention is described. FIG. 12 is a schematic diagram of a module having a light emitting diode part 402, a sensor 403 for monitoring the color tone of white light emission, and a control unit 404 with integrated circuit, each formed on a substrate 401.

Figure 13:
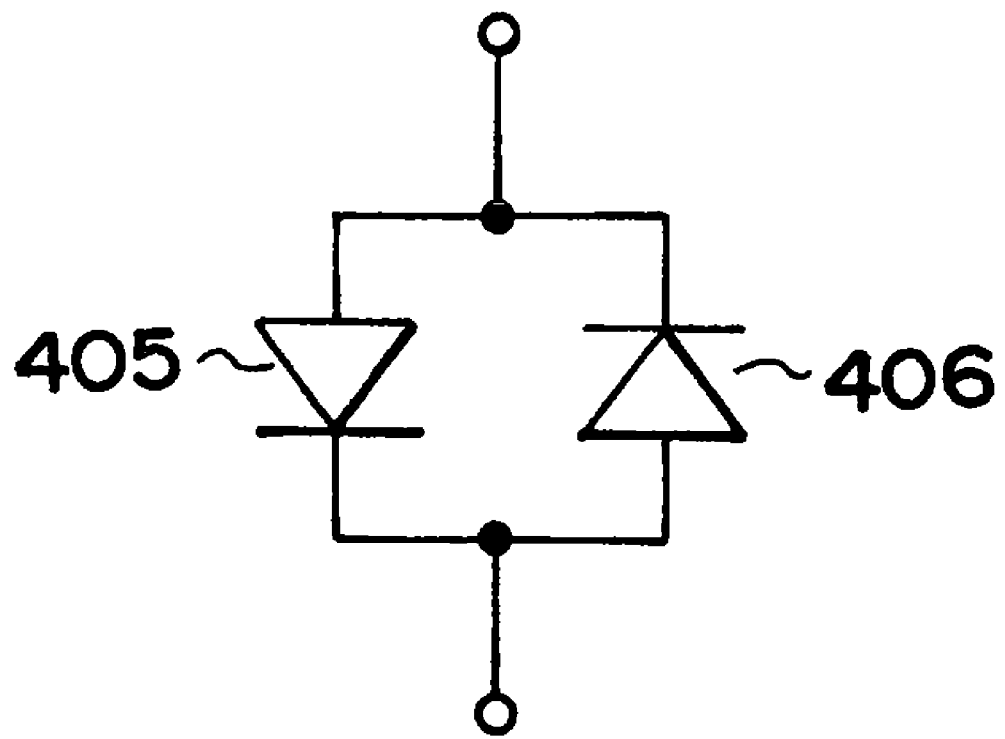
FIG. 13 shows an example of a protective circuit used in a control unit of the third monolithic light emitting device.
Figure 14:
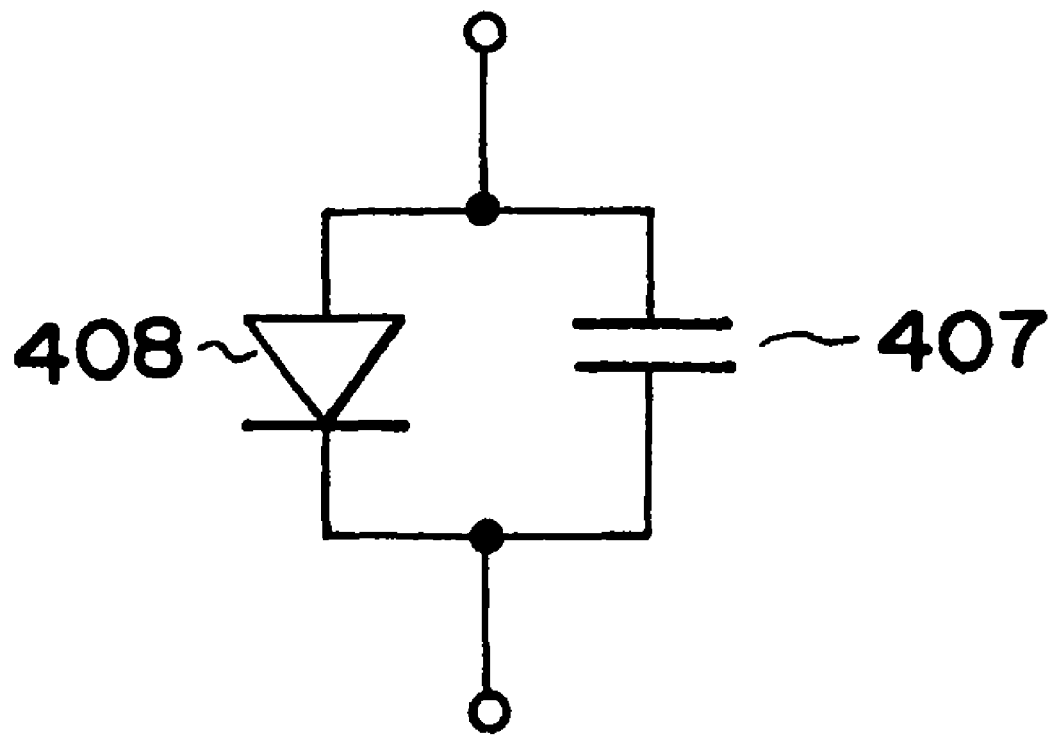
FIG. 14 shows an example of another protective circuit used in a control unit of the third monolithic light emitting device.

As the protective circuit formed in the control unit 404, diodes 405 and 406 having opposite polarities may be connected as shown in FIG. 13, alternatively, a capacitor 407 made of dielectric and a light emitting diode circuit 408 may be connected in parallel as shown in FIG. 14. The capacitor 407 made of dielectric can be produced by photo lithographical patterning of dielectric film and evaporating coating of metal electrodes.

Figure 15:
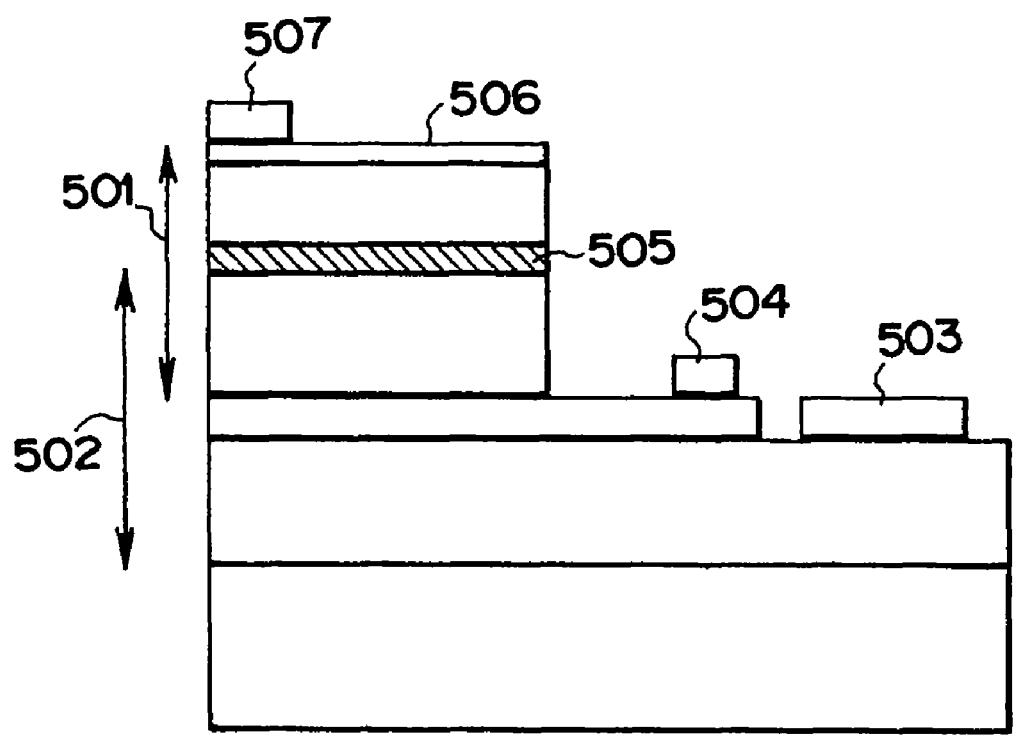
FIG. 15 shows a layer structure of the third monolithic light emitting device.
Figure 16:
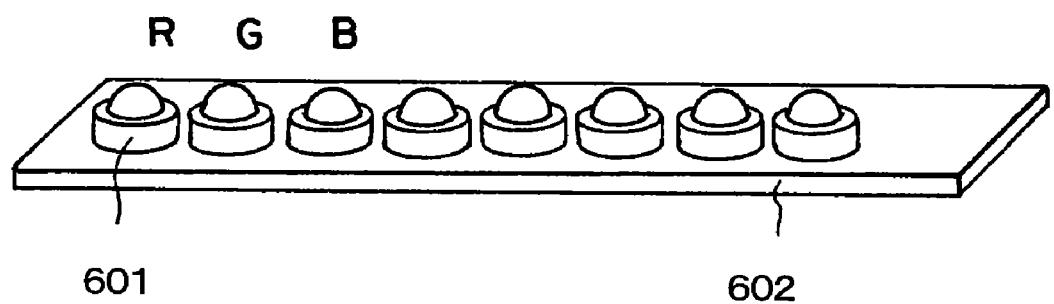
FIG. 16 shows an example of a white light emitting device according to a conventional technology using a light emitting diode.

As the switching circuit of the control unit 404, a bipolar transistor functional layer 502 can be formed below a light emitting diode functional layer 501 as shown in FIG. 15, to form a switching circuit together with the capacitor 407. In FIG. 14, the transistor functional layer 502 and the light emitting diode functional layer 501 are combined to give a thyristor structure of 1 pnpn. The transistor functional layer 502 is not limited to a bipolar transistor, and an field effect transistor can also be formed as the layer.

By forming one or more sensors around the light emitting diode functional layer 501, the light output thereof or the color tone of white light emission can be monitored and feedback-controlled.

In the above-described embodiment, for exciting a phosphor efficiently to cause light emission and for obtaining pseudo white by mixing of lights emitted from phosphors or mixing light emitted from a semiconductor active layer and light emitted from a phosphor, it is necessary that the light emitted from the semiconductor active layer has light energy of blue color or higher. Therefore, the light emitted from the semiconductor active layer has preferably a wavelength of about 470 nm or less. Examples of the material for emitting such light include nitride semiconductors having a wurtzite crystal structure such as GaN, InGaN, AlGaN; and ZnO.

The present invention is expected as a promising technology for providing lighting, detector and module having an analysis function used in a very limited space, such as capsule type gastric camera by oral administration, in addition to the above-described applications.

As the above described in detail on the embodiment of the present invention, in the first monolithic light emitting device, the color tones of light emitting diodes constituting an array are not limited, and for example, RGB three color tones, and other free color tones can be selected. In the third monolithic light emitting device, the color tones of light emitting diodes constituting an array are all limited to white, and it is possible to control color tone finely by combining white light emitting diode groups of different color tones such as daylight color, bulb color, warm white color though included in the same white color.

In contrast, in the second monolithic light emitting device, at least one diode showing white as a basic color is included as diodes constituting an array, and by combining other color than white, wider color tone including white as a basic tone is made possible. For example, a color tone like green tree shade which is white as a basic tone can be provided by adding green color as another color, and a color tone like relaxed moss color can be provided by adding orange color. Further, by adding ultraviolet ray having a repellent action against insects, lighting can be provided having an insect proof effect in addition to color tone.

Thus, from the viewpoint of widening range of color tone, the first monolithic light emitting device has widest one, the second monolithic light emitting device has the second widest one, followed by the third monolithic light emitting device. On the other hand, from the viewpoint of fine controllability around targeted color tone, and of stability for variable factors such as output variation and time change of individual light emitting diodes, the third monolithic light emitting device is best, the second monolithic light emitting device is the second best, followed by the first monolithic light emitting device.

EXAMPLES

Production examples of the monolithic light emitting device of the present invention and evaluation results thereof are illustrated.

Example 1

Sapphire having C-plane mirror-polished was used as a substrate. Crystal growth was carried out by MOVPE. An n-type GaN layer was grown by a two-step growth using low temperature-growing GaN as a buffer layer. InGaN well layer and non-doped GaN barrier layer are grown alternately to form a multi quantum well structure, and a Mg-doped p-type layer was grown.

Figure 17:
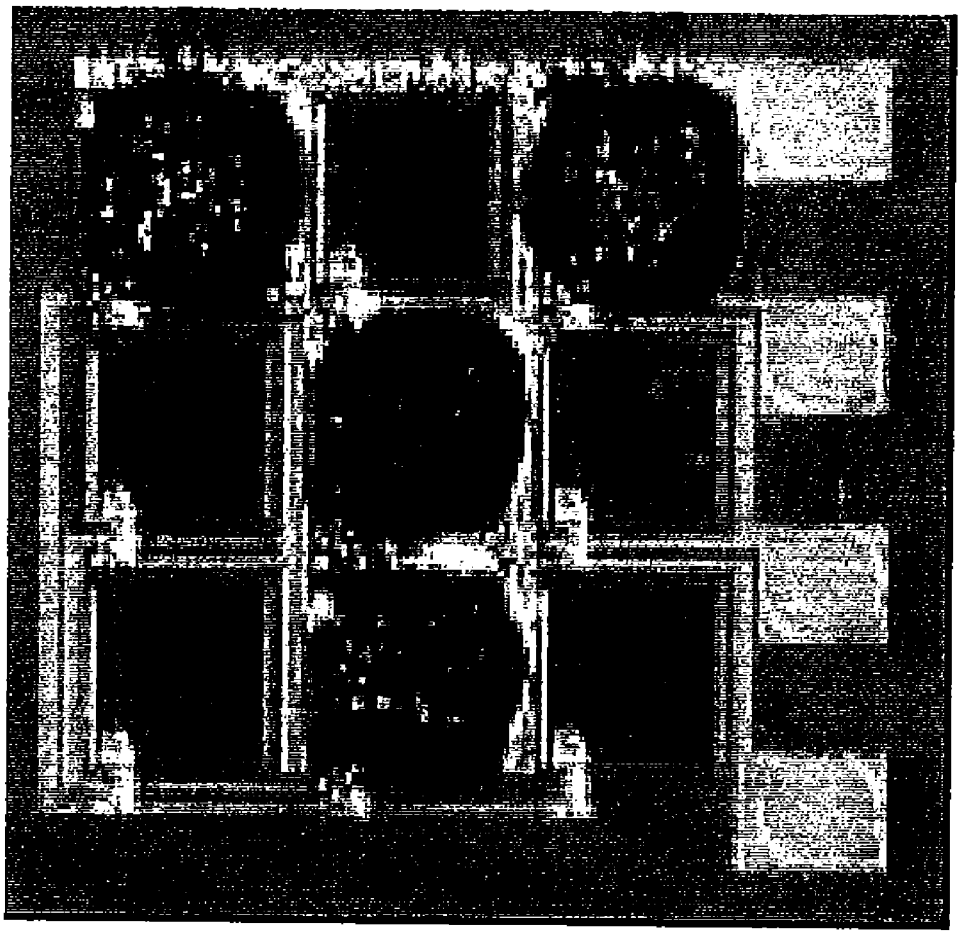
FIG. 17 is a stereomicrograph of 3×3 array.
Figure 18:
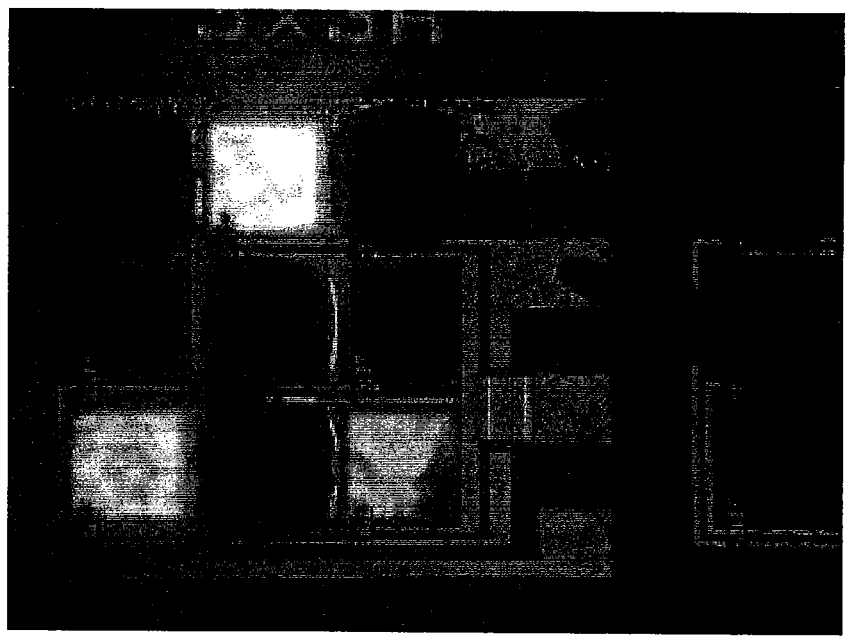
FIG. 18 is a stereomicrograph of light emitting condition in device operation.
Figure 19:
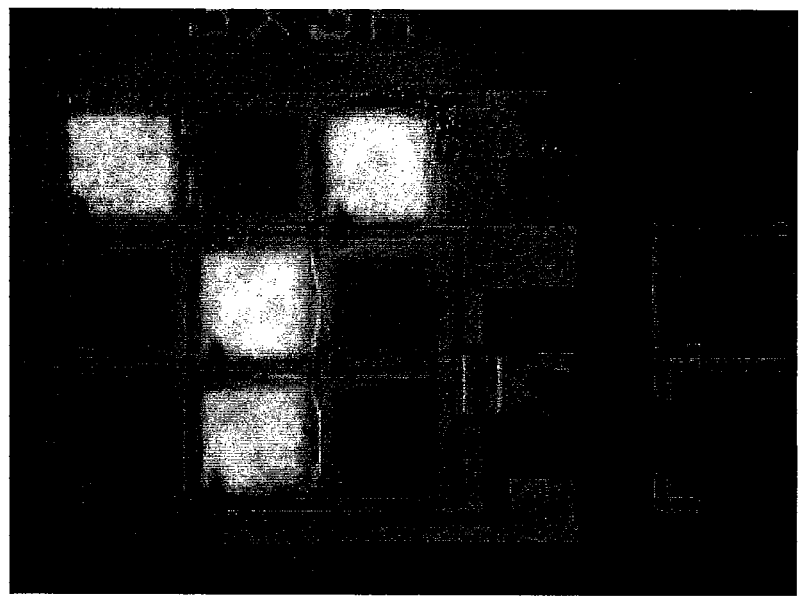
FIG. 19 is a stereomicrograph of light emitting condition in device operation.
Figure 20:
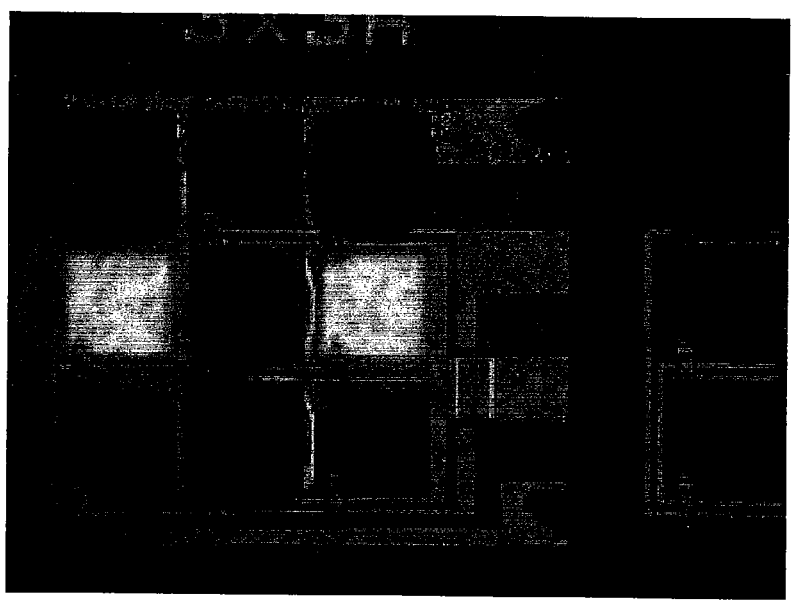
FIG. 20 is a stereomicrograph of light emitting condition in device operation.

A Ni—Au transparent electrode was formed on the resultant by an ordinary method to obtain a light emitting diode (hereinafter, abbreviated as LED). Al was used as the n electrode. Further, by repeating the photolithographic steps as described in the embodiment, a device including an array of 3×3 as shown in FIG. 17 was produced. One pixel has a size of 100 µm×100 µm. The device was tested. It was confirmed pixels of 1 to 3 groups emitted lights. FIGS. 18 to 20 were stereomicrographs in device operation. Thereafter, viscous liquid prepared by mixing a phosphor (terbium.aluminum. garnet) and ultraviolet-hardening resin was coated on the pixel by screen printing (MT-320, manufactured by Microtech). In this case, the viscosity of the viscous liquid was regulated by the mixing ratio of the phosphor and the ultraviolet-hardening resin. In this case, 13 g of the resin and 0.5 g of the harder were mixed with 5.5 g of the phosphor.

The viscous liquid was coated on pixels of the group 2 at twice based on coating amount coated on pixels of the groups 1and 3. The coating amount was able to be controlled by adjusting the times of coating using the screen printer.

Figure 21:
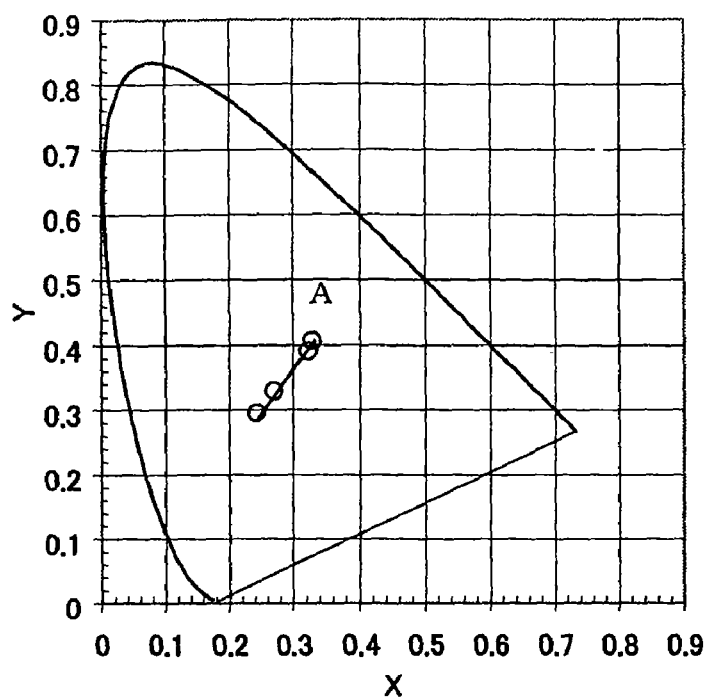
FIG. 21 shows color tone change depending on electrical current.

It was confirmed the color tone changed by controlling the electric current on pixels of the groups 1 and 3 and the group 2. FIG. 21 showed the color tone change, and it was confirmed the color tone changed along line A on the chromaticity diagram shown in FIG. 21.

INDUSTRIAL APPLICABILITY

According to the present invention, a monolithic light emitting device being excellent in color tone stability, capable of controlling color tone, and suitable for miniaturizing, a lighting device using the same and a driving method therefore, are provided.

The invention claimed is:

1. A monolithic light emitting device for lighting comprising a plurality of light emitting diodes array-arranged monolithically on a single substrate, wherein
   the light emitting diodes comprise
   a pn junction-containing semiconductor material and
   a phosphor-containing layer passing light emitted from the semiconductor material, or absorbing part or the whole of the light for conversion into light with a different wavelength, and
   the array is constituted of a light emitting diode group consisting of m (m≧2) pieces of the light emitting diode,
   the light emitting diode group is constituted of N types (N≧2, providing N≦m) of light emitting diodes each having either one of preset N types of light emitting spectrum patterns, and
   an average light emitting spectrum from the whole array can be changed by regulating a power supplied to the light emitting diodes for each light emitting diode group sorted according to the type of the light emitting spectrum pattern.

2. A lighting monolithic light emitting device for lighting comprising a plurality of light emitting diodes array-arranged monolithically on a single substrate, wherein
   the light emitting diodes comprise
   a pn junction-containing semiconductor material and
   a phosphor-containing layer passing light emitted from the semiconductor material, or absorbing part or the whole of the light for conversion into light with a different wavelength, and the array is constituted of a light emitting diode group consisting of m (m≧2) pieces of the light emitting diode,
   the light emitting diode group is constituted of N types (N≧2, providing N≦m) of light emitting diodes having N types of light emitting spectrum patterns and having at least one kind of white light emitting spectrum pattern, and
   an average light emitting spectrum from the whole array can be changed by regulating a power supply for each light emitting diode group sorted according to the type of the light emitting spectrum pattern.

3. A monolithic light emitting device for lighting comprising a plurality of light emitting diodes array-arranged monolithically on a single substrate, wherein
   the light emitting diodes comprise
   a pn junction-containing semiconductor material and
a phosphor-containing layer passing light emitted from the semiconductor material, or absorbing part or the whole of the light for conversion into light with a different wavelength, and
the array is constituted of a light emitting diode group consisting of m (m≧2) pieces of the light emitting diode,
   the light emitting diode group is constituted of N types (N≧2, providing N≦m) of light emitting diodes each having either one of preset N types of white light emitting spectrum patterns, and
   an average light emitting spectrum from the whole array can be changed by regulating a power supplied to the light emitting diodes for each light emitting diode group sorted according to the type of the white light emitting spectrum pattern.

4. The device according to claim 1, comprising:
   electrode parts on each one side of the light emitting diodes constituting the light emitting diode group are connected to a group-common electrode,
   electrode parts on each another side of the light emitting diodes constituting the light emitting diode group are connected, for each light emitting diode group, to N pieces of electrode common to the group provided corresponding to the light emitting diode group, wherein
intensities or light emitting spectrum patterns for N types of emitting spectra can be changed and an average light emitting spectrum from the whole array can be changed by regulating a power supplied through the group-common electrode and N pieces of electrode common to the group.

5. The device according to claim 1, comprising:
at least one electric conductive semiconductor layer mutually common to a plurality of pn junction-containing light emitting diodes constituting the light emitting diode group,
wherein the electric conductive semiconductor layer has in common an electric conductive layer situated at a nearer position to the substrate, and wiring for connecting the electrode parts of the light emitting diodes constituting the light emitting diode group to an electrode part for external connection is monolithically formed on the substrate.

6. The device according to claim 1, wherein the phosphor-containing layer is in close to, or is connected directly to the light emitting diode including the pn junction semiconductor.

7. The device according to claim 1, wherein the m pieces of light emitting diode of the array are formed so close to mutually that emitting spectra from a light emitting diode cannot be distinguished from emitting spectra of the other light emitting diode under environment where a lighting is used.

8. The device according to claim 1, comprising:
light mixing parts containing a light scattering member in the light emitting directions from the m pieces of light emitting diode of the array, wherein
the m pieces of light emitting diode of the array are formed so close to mutually that emitting spectra from a light emitting diode cannot be distinguished from emitting spectra of the other light emitting diode under environment where a lighting is used.

9. The device according to claim 1, comprising:
a light receiving device formed monolithically on the substrate close to the light emitting diodes,
an electrode necessary for electrically connecting the light receiving device to the outside, and
a connection wiring thereof, to absorb part of light from the light emitting diode, leading to generate electromotive force to supply electricity for outside.

10. The device according to claim 1, wherein a capacitor which is made of dielectric material or diode which has opposite polarity to the light emitting diode is formed on the substrate closed to the light emitting diode, said capacitor or diode is connected in parallel with the light emitting diode.

11. The device according to claim 1, wherein the wavelength of light emitted from the semiconductor of the light emitting diode is 470 nm or less.

12. The device according to claim 1, wherein the semiconductor of the light emitting diode is a nitride semiconductor having a wurtzite crystal structure.

13. The device according to claim 1, wherein the phosphor of the light emitting diode is made of organic material.

14. The device according to claim 1, wherein the phosphor of the light emitting diode is made of polymer material.

15. A lighting comprising the device according to claim 1.

16. A method of driving the monolithic light emitting device according to claim 1, wherein the light emitting diode is controlled by the driving current or driving time for each of the light emitting diode group, to control the whole average light emitting spectrum pattern.

17. A method of driving the monolithic light emitting device according to claim 9, wherein the whole average light emitting spectrum pattern is feedback-controlled in accordance with output of the light receiving device.

* * * * *